(12) United States Patent
Kitano

(10) Patent No.: US 12,170,255 B2
(45) Date of Patent: Dec. 17, 2024

(54) SEMICONDUCTOR DEVICE INCLUDING BASE MEMBER WITH PROTRUDING PORTION AT CIRCUMFERENTIAL EDGE

(71) Applicant: Mitsubishi Electric Corporation, Tokyo (JP)

(72) Inventor: Toshiaki Kitano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 411 days.

(21) Appl. No.: 17/595,704

(22) PCT Filed: Aug. 30, 2019

(86) PCT No.: PCT/JP2019/034094
§ 371 (c)(1),
(2) Date: Nov. 22, 2021

(87) PCT Pub. No.: WO2021/038824
PCT Pub. Date: Mar. 4, 2021

(65) Prior Publication Data
US 2022/0254742 A1   Aug. 11, 2022

(51) Int. Cl.
*H01L 23/66* (2006.01)
*H01L 21/52* (2006.01)
(Continued)

(52) U.S. Cl.
CPC ............ *H01L 23/66* (2013.01); *H01L 23/481* (2013.01); *H01L 24/32* (2013.01); *H01L 2224/32221* (2013.01)

(58) Field of Classification Search
CPC ............ H01L 21/52; H01L 2223/6616; H01L 2224/32221; H01L 21/822; H01L 27/04;
(Continued)

(56) References Cited

U.S. PATENT DOCUMENTS 5,027,189 A   6/1991   Shannon et al.
5,037,782 A   8/1991   Nakamura et al.
(Continued)

FOREIGN PATENT DOCUMENTS

JP   H02-140969 A   5/1990
JP   H02-257643 A   10/1990
(Continued)

OTHER PUBLICATIONS

International Search Report issued in PCT/JP2019/034094; mailed Nov. 19, 2019.
(Continued)

*Primary Examiner* — Herve-Louis Y Assouman
(74) *Attorney, Agent, or Firm* — Studebaker & Brackett PC

(57) ABSTRACT

A semiconductor device is configured to include: a base member of a semiconductor material which forms a thin plate shape; a front face electrode which is placed on a front surface of the base member; a rear face electrode which covers a rear surface of the base member; and a via hole which forms a hole shape provided with the front face electrode as a bottom and being open onto the rear surface, and through which the front face electrode and the rear face electrode are electrically connected to each other; wherein, at a circumferential edge portion of the base member on its side where the rear surface is located, a protrusion portion which protrudes in a thickness direction is disposed.

16 Claims, 7 Drawing Sheets

(51) Int. Cl.
*H01L 21/822* (2006.01)
*H01L 23/00* (2006.01)
*H01L 23/48* (2006.01)
*H01L 27/04* (2006.01)

(58) Field of Classification Search
CPC ....... H01L 23/66; H01L 23/481; H01L 24/32; H01L 2224/32; H01L 2924/10158
See application file for complete search history.

(56) References Cited

U.S. PATENT DOCUMENTS

| | | |
|---|---|---|
| 6,268,619 B1 | 7/2001 | Kosaki et al. |
| 2001/0028113 A1 | 10/2001 | Kosaki et al. |
| 2014/0051228 A1* | 2/2014 | Chausse ............ H01L 21/76224 |
| | | 438/424 |
| 2018/0240753 A1* | 8/2018 | LaRoche ........... H01L 21/28575 |

FOREIGN PATENT DOCUMENTS

| | | |
|---|---|---|
| JP | H04-211137 A | 8/1992 |
| JP | H10-303198 A | 11/1998 |
| JP | 2008-153275 A | 7/2008 |

OTHER PUBLICATIONS

Office Action issued in JP 2019-567746; mailed by the Japanese Patent Office on Feb. 4, 2020.

An Office Action mailed by China National Intellectual Property Administration on Aug. 7, 2024, which corresponds to Chinese Patent Application No. 201980098431.7 and is related to U.S. Appl. No. 17/595,704; with English language translation.

\* cited by examiner

SEMICONDUCTOR DEVICE INCLUDING BASE MEMBER WITH PROTRUDING PORTION AT CIRCUMFERENTIAL EDGE

TECHNICAL FIELD

The present application relates to a semiconductor device.

BACKGROUND ART

When, from among various semiconductor devices, a high-frequency integrated circuit such as an MMIC (Monolithic Microwave Integrated Circuit), that deals with a microwave band, a quasi-microwave band or the like, is formed, the influence of a parasitic inductance becomes non-negligible. Thus, a structure is employed in which a via hole passing through a semiconductor substrate is created, so that an electrode formed on the front surface side of the semiconductor substrate is grounded by being connected to a conductor on the rear surface side thereof, without drawing a wire on its surface.

For the above semiconductor substrate with which the high-frequency integrated circuit is configured, a so-called wide bandgap semiconductor material such as GaAs, GaN, SiC or the like is preferably used. In this instance, at the time of bonding the semiconductor substrate to an assembly board by using a solder material (die bonding), if the solder material whose linear expansion coefficient differs from that of the substrate creeps up into the via hole, a risk arises that a crack will occur by a temperature change. Accordingly, there is proposed a semiconductor device in which, in order to prevent such creeping up of the solder material, a portion forming the opening of the via hole is covered with a solder non-wettable material (see, for example, Patent Documents 1, 2).

CITATION LIST

Patent Document

Patent Document 1: Japanese Patent Application Laid-open No. H04-211137 (Paragraphs 0016 to 0021; FIG. 1)
Patent Document 2: Japanese Patent Application Laid-open No. H10-303198 (Paragraphs 0051 to 0060; FIG. 5 to FIG. 6, and Paragraphs 0082 to 0094; FIG. 11 to FIG. 12)

SUMMARY OF THE INVENTION

Problems to be Solved by the Invention

When the creeping up of the solder material into the via hole is inhibited, it is conceivable to be able to suppress the occurrence of a crack due to the difference in linear expansion coefficient. Meanwhile, in the actual manufacturing site, such cases may arise where, foreign substances are adhered, even though only slightly, to a surface of the semiconductor substrate to be bonded to the assembly board, so that, when the die bonding is performed in this state, a portion around the via hole may be cracked by an impact. A crack may occur even when the foreign substance is adhered at a position apart from the via hole, and in addition, it is hard to remove every minute foreign substance. Thus, the occurrence of a crack cannot be prevented completely, and thus, it is difficult to increase the yield.

This application discloses a technique for solving such a problem described above, and an object thereof is to provide a semiconductor device with a reduced parasitic inductance and a high productivity.

Means for Solving the Problems

A semiconductor device disclosed in this application is characterized by comprising: a base member of a semiconductor material which forms a thin plate shape; a front face electrode which is placed on one of surfaces of the base member; a rear face electrode which covers another one of the surfaces of the base member; and a via hole which forms a hole shape provided with the front face electrode as a bottom and being open onto said another surface, and through which the front face electrode and the rear face electrode are electrically connected to each other; wherein, at a circumferential edge portion of the base member on its side where said another surface is located, a protrusion portion which protrudes in a thickness direction is disposed intermittently along a circumferential direction.

Effect of the Invention

According to the semiconductor device disclosed in this application, it is configured not to receive an impact if a foreign substance is so adhered. Thus, it is possible to provide a semiconductor device with a high productivity.

MODES FOR CARRYING OUT THE INVENTION

Embodiment 1

Figure 1A:
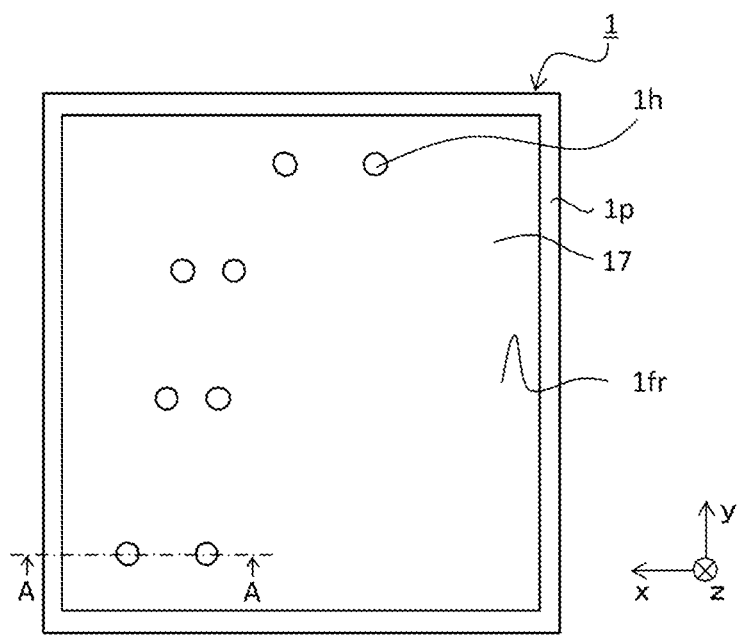
FIG. 1A to FIG. 1C are, respectively, a plan view of a semiconductor device according to Embodiment 1 viewed from its rear face side, a sectional end view thereof, and a sectional end view thereof in a state bonded to an assembly board.
Figure 1B:
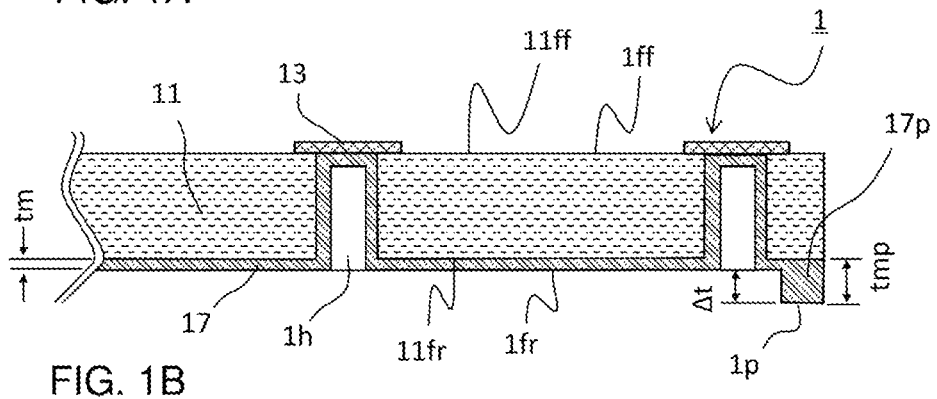
Figure 1C:
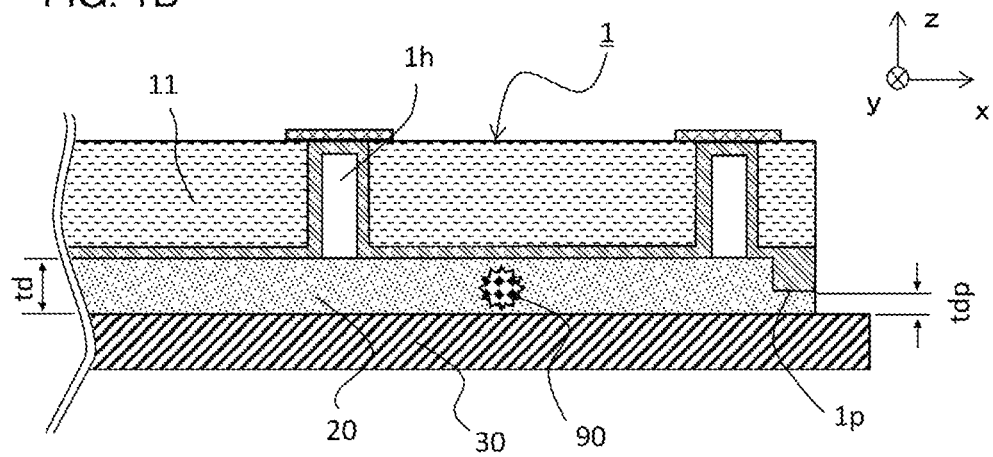
Figure 2:
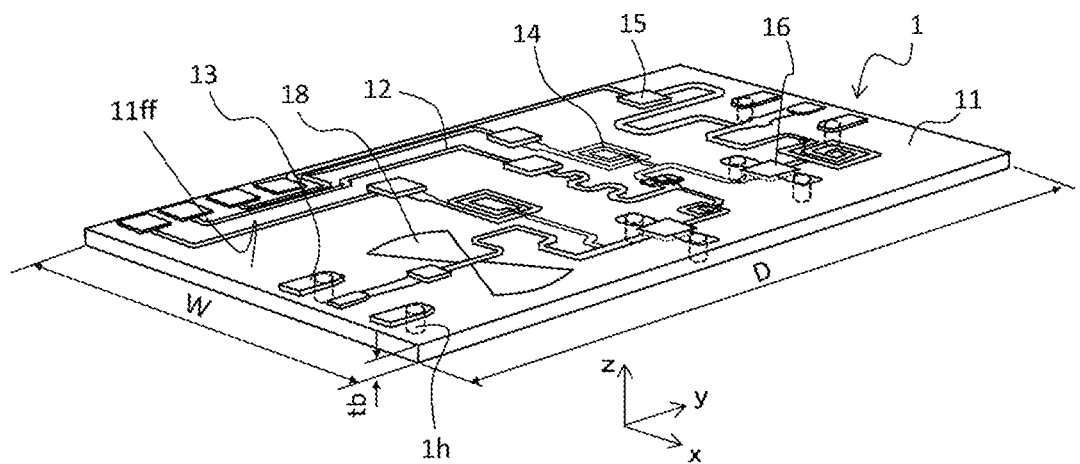
FIG. 2 is a perspective view of the semiconductor device according to Embodiment 1.
Figure 3:
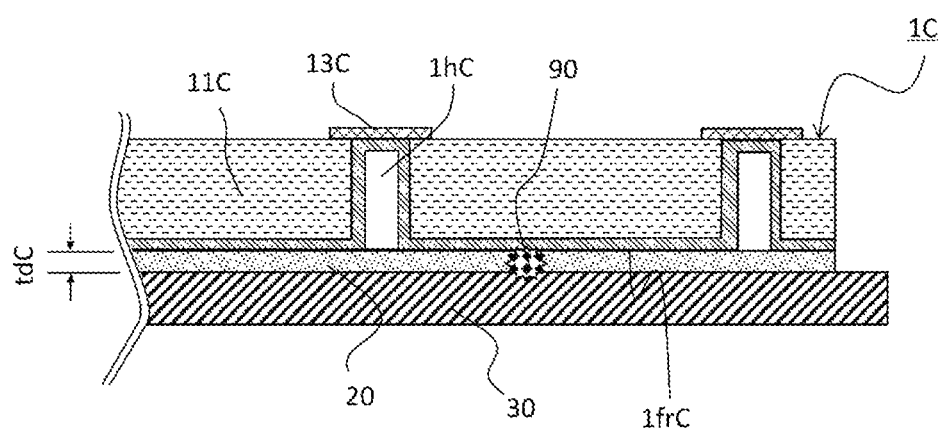
FIG. 3 is a sectional end view of a semiconductor device according to a comparison example in a state bonded to an assembly board.

FIG. 1A to FIG. 1C, FIG. 2 and FIG. 3 serve for explaining a configuration of a semiconductor device according to Embodiment 1 and effects thereof, in which FIG. 1A to FIG. 1C show a plan view (FIG. 1A) of the semiconductor device as viewed from the side of its rear surface serving as a surface to be bonded to an assembly board; a sectional end view (FIG. 1B) taken along an A-A line in FIG. 1A; and a sectional end view (FIG. 1C) corresponding to FIG. 1B, of the semiconductor device in a state bonded to the assembly board. Further, FIG. 2 is a perspective view of the semiconductor device as viewed from the side of its front surface as a mounting surface. In addition, FIG. 3 is a sectional end view showing a semiconductor device according to a comparison example in a state bonded to an assembly board, and corresponds to FIG. 1C.

The semiconductor device according to each of Embodiments in this application is such a semiconductor device in which an integrated circuit or semiconductor elements is/are formed in a base member of a semiconductor material, said integrated circuit or said semiconductor elements being provided with a high-frequency electronic circuit such as an MMIC formed therein; and in which a via hole for causing an electrode placed on the front surface side to be grounded by electrically connecting it to a rear face electrode is provided. Here, prior to describing a characteristic configuration of the semiconductor device according to this application, description will be made about a configuration of a semiconductor device having a via hole.

In a semiconductor device 1, as shown in FIG. 2, semiconductor elements 16 such as a switching element, a rectifier element and the like are formed in a base member 11 made up of a semiconductor material, and on a front surface 11$f\!f$, electronic components such as, for example, an inductor 14, a capacitor 15, an antenna 18, a resistor and the like are disposed. Furthermore, there are formed a wiring pattern 12 for making electrical connections for the respective electronic components; a front face electrode 13; and via holes 1$h$ that are each open onto a rear surface 11$fr$ (FIG. 1A to FIG. 1C) of the base member 11 and whose inner walls are each covered with a conductor connected to the front surface electrode.

The base member 11 is a substrate of a so-called wide bandgap semiconductor material such as GaAs, GaN, SiC or the like, or the substrate with an additional epi layer formed (epitaxially grown) thereon, and is formed into a thin plate shape. In many cases, its width W is 1 mm, its length D is about 1 mm or more and its thickness tb is about 0.1 mm. The front face electrode 13 is an electrode formed mainly using, for example, gold (Au) as its material, by vacuum deposition, sputtering, plating or the like.

The via holes 1$h$ are each a bottomed hole that is bored in the base member 11 from the rear surface side to reach the front face electrode 13 by dry etching or wet etching, and as shown in FIG. 1A and FIG. 1B, its inner wall is covered with a conductor that is continued to a rear face electrode 17, so that the via hole is electrically continuous with the front face electrode 13. Each of the via holes 1$h$ has an inner diameter of about 0.05 to 0.1 mm, and the conductor part covering the inner wall is formed integrally with the rear face electrode 17 with a thickness of 1 to 5 μm, and Au is, for example, used therefor.

The thus-configured semiconductor device 1 is used, as shown in FIG. 1C, in a state joined by a die bonding member 20 to an assembly board 30. As the material of the die bonding member 20, for example, a solder material such as gold tin (AuSn), an electroconductive resin or the like is used, and its thickness is 5 μm to 25 μm. As the material of the assembly board 30, for example, copper (Cu), a ceramic, a resin or the like is used.

In this state, among the electronic components mounted on the front surface 11$f\!f$, an electronic component connected to the front face electrode 13 that is electrically continuous with the via hole 1$h$, is grounded by being electrically connected in the thickness direction to the rear face electrode 17, without passing through any detour path on the front surface 11$f\!f$. For example, at the time the front face electrode of the semiconductor element 16 (a source electrode, mostly for a field effect transistor, or an emitter electrode, mostly for a bipolar transistor) is to be grounded, when it is grounded by way of the via hole 1$h$, the parasitic inductance can be reduced as compared with the case where it is grounded using a wire. This makes it possible to improve the high frequency characteristic and to reduce the chip area.

In addition, in the semiconductor device 1 according to each of Embodiments in this application, a protrusion portion 1$p$ which protrudes in the thickness direction (z-direction) is formed at a circumferential edge portion of a rear surface 1$fr$ serving as a surface to be bonded to the assembly board 30, so that, over a major area, the semiconductor device has a gap of a predetermined size or more between it and the assembly board 30. Hereinafter, details of Embodiments will be described individually.

In the semiconductor device 1 according to Embodiment 1, the protrusion portion 1$p$ is formed in such a manner that, at a circumferential edge portion of the rear face electrode 17, a thick film part 17$p$ of that electrode having a thickness tmp that is thicker than a thickness tm of that electrode on a major area where the via hole 1$h$, etc. are located, is formed. This configuration can be achieved such that, at the time of formation of the rear face electrode 17, after forming it on the entire area with a uniform thickness tm, a pattern is formed thereon using, for example, a resist, whereby only the circumferential chip-edge portion of that electrode is selectively thickened up to the thickness tmp.

Specifically, when the thickness tmp at the circumferential edge portion is made thicker by 20 μm than the thickness tm in the major area of the rear face electrode 17, a protrusion height Δt in the thickness direction (z-direction) of the protrusion portion 1$p$ is 20 μm, so that the circumferential edge portion protrudes by 20 μm relative to the major area. Note that the thickness tm in the major area of the rear face electrode 17 is, generally, about 1 to 6 μm, and when the thickness tm is 5 μm, by setting the thickness tmp at the circumferential edge portion to 25 μm, the protrusion height Δt becomes 20 μm.

Meanwhile, when the semiconductor device 1 is bonded by die bonding to the assembly board 30, a thickness td of the die bonding member 20, even though it is possibly distributed in a range from 5 to 25 μm, generally falls in a range from 7 to 15 μm. Further, as a foreign substance 90 adhered onto the rear face electrode 17 of the semiconductor device 1, a gold particle is assumed that is produced at the time of formation of the rear face electrode 17, which exists with a height that will still remain at 15 to 25 μm (effective height) when subjected to a load, even though it varies depending on the manufacturing condition.

With such a condition, let's consider the case where the semiconductor device 1 according to this application and a semiconductor device as a comparison example without having the protrusion portion 1$p$, are die-bonded to their respective assembly boards 30. Note that, for the semiconductor device according to the comparison example, in order to distinguish it from the semiconductor device 1 according to this application, a mark "C" is affixed to the end of each reference numeral as shown in FIG. 3, so that, for example, it is referred to as a semiconductor device 10. Further, it is assumed that similar foreign substances 90 are respectively adhered onto the rear surface 1*fr* of the semiconductor device 1 and a rear surface 1*fr*C of the semiconductor device 10, and these devices are bonded by die bonding using the die bonding members 20 with the same specification to the assembly boards 30 with the same specification.

In the semiconductor device 10 according to the comparison example, at the time of die bonding, a gap between the rear surface 1*fr*C and the assembly board 30 through the die bonding member 20, namely, a thickness tdC of the die bonding member 20, has any one of the values in the range from 7 to 15 μm. Accordingly, even if the thickness tdC of the die bonding member 20 is maximum 15 μm, when, among adhered foreign substances 90, there is a foreign substance whose effective height exceeds 15 μm, a load is concentrated on a portion around the foreign substance 90 at the time of die bonding.

On this occasion, even if a portion inside a base member 11C where a via hole 1*h*C is formed is apart from the load-concentrated foreign substance 90, a stress may be concentrated on that portion, resulting in an increased possibility of the occurrence of a crack beginning at the via hole 1*h*C. In other words, when the aforementioned foreign substance whose height will remain at 15 to 25 μm is included, there is a risk, unless the foreign substance is removed, that a crack may occur and thus the yield may be reduced.

Further, if the thickness tdC of the die bonding member 20 is minimum 7 μm, when, among the adhered foreign substances 90, there is a foreign substance whose effective height exceeds 7 μm, a crack will occur, and it becomes more difficult to remove the foreign substance to thereby suppress the occurrence of a crack.

In contrast, in the semiconductor device 1 according to Embodiment 1, with respect to the thickness of the die bonding member 20, a thickness tdp at its circumferential edge portion has any one of the values in the range from 7 to 15 μm, at the time of die bonding, that is similar to the thickness in the semiconductor device 10 according to the comparison example. However, the thickness td on the major area is thicker, to an extent corresponding to the protrusion height Δt, than the thickness tdp at the circumferential edge portion. Thus, when the protrusion height Δt is 20 μm, the thickness td on the major area reaches 27 μm even if the thickness tdp is minimum 7 μm.

Accordingly, if the foreign substance 90 has an effective height of less than 27 μm, it is never in contact with both the rear surface 1*fr* of the semiconductor device 1 and the assembly board 30 simultaneously, as shown in FIG. 1C, so that no load is concentrated on the foreign substance 90 and thus the occurrence of a crack can be prevented. Said differently, when the foreign substance 90 whose effective height exceeds 27 μm can be eliminated, it is possible to prevent the occurrence of a crack due to the foreign substance 90 to thereby increase the yield.

Furthermore, when the thickness tdp at the circumferential edge portion is maximum 15 μm, it is possible to prevent the occurrence of a crack if the foreign substance 90 has the height of less than 35 μm. Thus, the substances to be removed can be narrowed down to those having an effective height of 35 μm or more, so that it is possible to increase the yield while saving the time and effort for removal.

It is noted that, when the maximum effective height of the foreign substance 90 has any one of the values from 15 to 25 μm according to manufacturing processes, the protrusion height Δt required for avoiding the occurrence of a crack is determined to be 8 to 18 μm according to a simple calculation based on the minimum thickness tdp (7 μm). However, when the manufacturing fluctuation is taken into account, it is desired that the protrusion height Δt have a margin of 5 μm and thus its set value be set in the range from 13 to 23 μm.

However, depending on manufacturing processes, there are cases, even though rarely, where the effective height of the foreign substance 90 reaches 50 μm. In these cases, even though the required amount of the die bonding member 20 increases, the protrusion height Δt may possibly be set up to 43 μm at a maximum. On the other hand, practically, the thickness tdp of the die bonding member 20 at the circumferential edge portion is about 10 μm in many cases. When these facts are taken into account, the set value of the protrusion height Δt may be set in the range from 10 to 40 μm.

Embodiment 2

In the above Embodiment 1, a case has been described where the protrusion portion is formed by varying the thickness of the rear face electrode. In Embodiment 2, a case will be described where the protrusion portion is formed by varying the thickness of the base member itself.

Figure 4A:
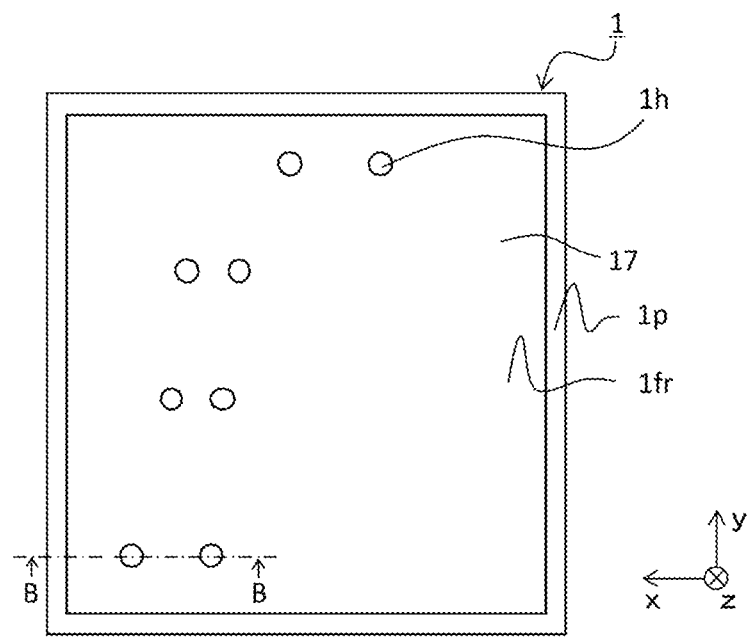
FIG. 4A to FIG. 4C are, respectively, a plan view of a semiconductor device according to Embodiment 2 viewed from its rear face side, a sectional end view thereof, and a sectional end view thereof in a state bonded to an assembly board.
Figure 4B:
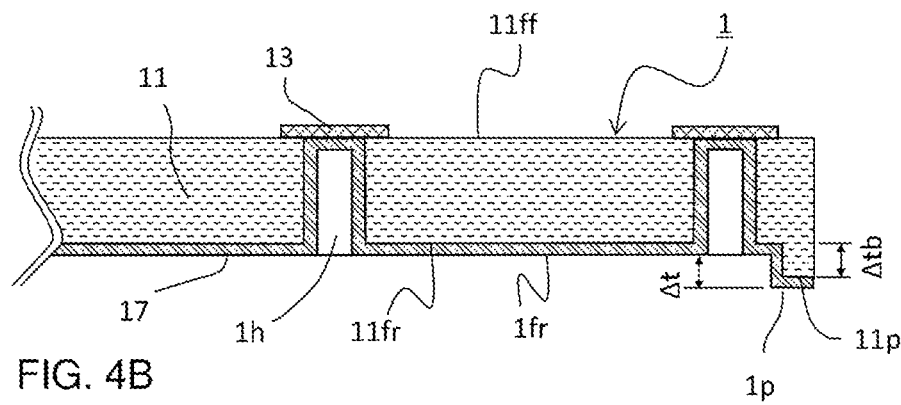
Figure 4C:
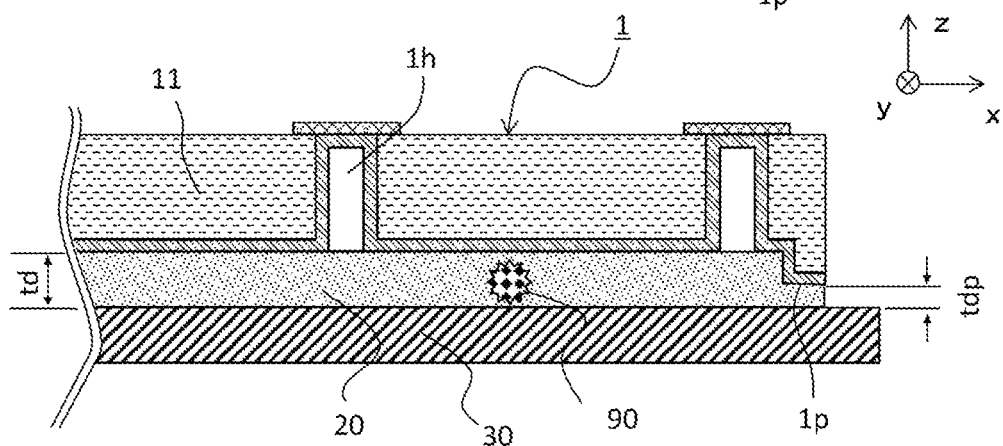

FIG. 4A to FIG. 4C serve for explaining a configuration of a semiconductor device according to Embodiment 2, and shows a plan view (FIG. 4A) of the semiconductor device as viewed from the side of its rear surface serving as a surface to be bonded to an assembly board; a sectional end view (FIG. 4B) taken along a B-B line in FIG. 4A; and a sectional end view (FIG. 4C) corresponding to FIG. 4B, of the semiconductor device in a state bonded to the assembly board. In Embodiment 2, the configuration other than the protrusion portion is same as that in Embodiment 1, so that, for the same components, the same reference numerals will be given. Further, FIG. 2 will be also employed without change.

Also in the semiconductor device 1 according to Embodiment 2, as shown in FIG. 4A to FIG. 4C, a protrusion portion 1*p* which protrudes in the thickness direction is formed at the circumferential edge portion on the rear surface 1*fr*-side. Further, as has been described in Embodiment 1 using FIG. 2, there are formed the wiring pattern 12 for making electrical connections for the respective electronic components; the front face electrode 13; and the via holes 1*h* that are each open onto the rear surface 11*fr* of the base member 11 and whose inner walls are each covered with a conductor for making an electrical connection with the front face electrode 13.

In the semiconductor device 1 according to Embodiment 2, as shown in FIG. 4B, the protrusion portion 1*p* is formed in such a manner that, at the circumferential edge portion of the base member 11 on its side where the rear face electrode 17 is to be formed, a base-member protrusion part 11*p* with a protrusion height Δtb is formed and is then covered using the rear face electrode 17 with a uniform thickness.

For this configuration, the base member 11 is formed into a thin plate shape like in Embodiment 1 and then, an epi layer is further formed selectively on the circumferential edge portion on the side where the rear face electrode 17 is to be formed, to thereby form the base-member protrusion part 11*p* with the protrusion height Δtb. Then, after the formation of the front face electrode 13 and boring of the via holes 1*h*, the rear face electrode 17 with a uniform thickness tm (1 to 5 μm), for example, is formed entirely on the rear surface, so that the protrusion portion 1p with the protrusion height Δt (≈Δtb) can be achieved.

Although the protrusion portion 1p differs from that of Embodiment 1 in terms of internal structure, they could be considered to be the same in terms of contour, so that the device is used, as shown in FIG. 4C, in a state joined using the die bonding member 20 to the assembly board 30. At that time, when the protrusion height is set similar to the protrusion height Δt (the protrusion height Δtb, in manufacturing setting) described in Embodiment 1, a function that is similar to that in Embodiment 1 is obtained against the foreign substance 90 and thus, operations and effects similar to the foregoing will be achieved.

Embodiment 3

In the above Embodiment 1 or 2, a case has been described where the protrusion portion is formed at the circumferential edge portion entirely circumferentially without disconnection. In Embodiment 3 here and Embodiment 4 to be described later, cases will be described where a plurality of protrusion portions is disposed intermittently along the circumferential edge portion.

Figure 5:
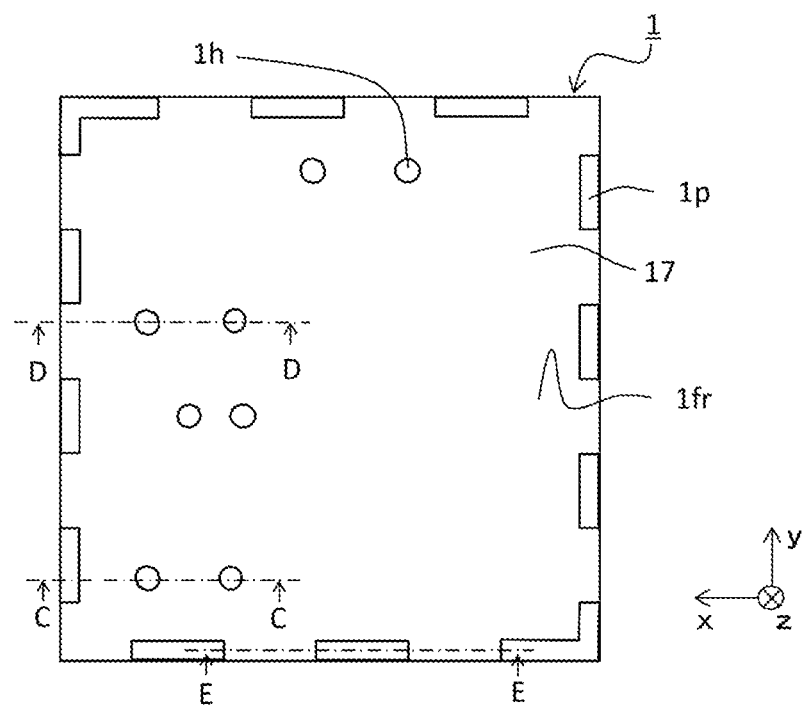
FIG. 5 is a plan view of a semiconductor device according to Embodiment 3 viewed from its rear face side.
Figure 6A:
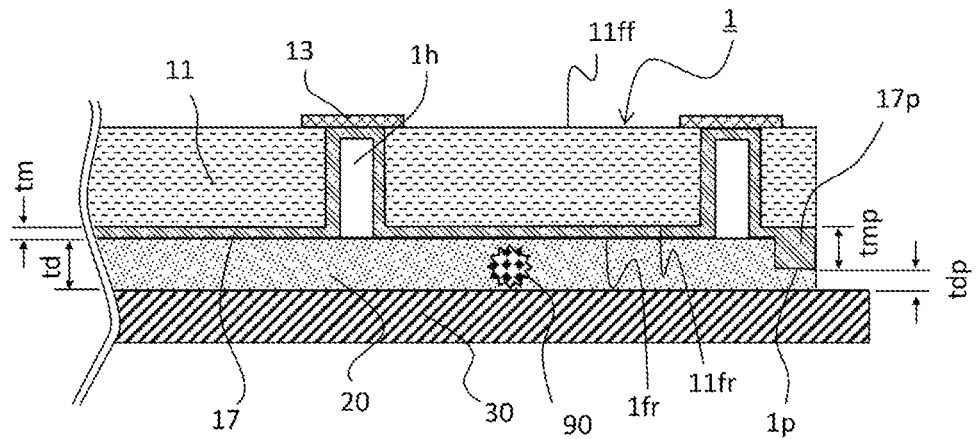
FIG. 6A to FIG. 6C are, respectively, sectional end views at different cutting positions, of the semiconductor device according to Embodiment 3 in a state bonded to an assembly board.
Figure 6B:
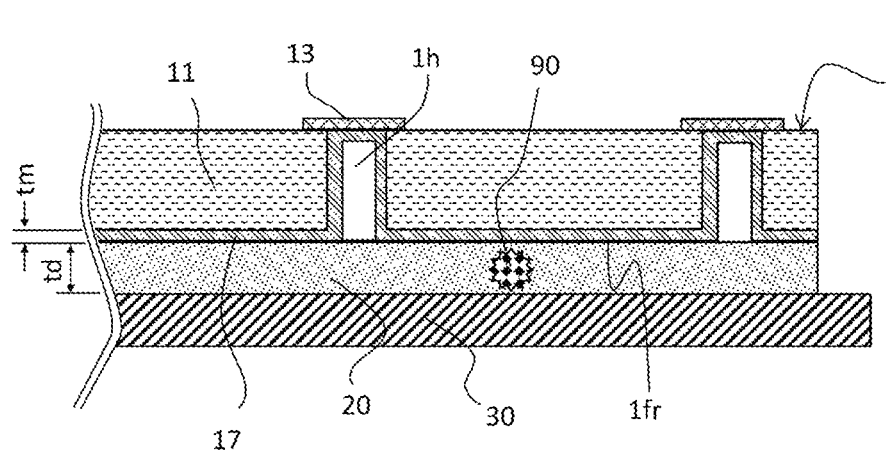
Figure 6C:
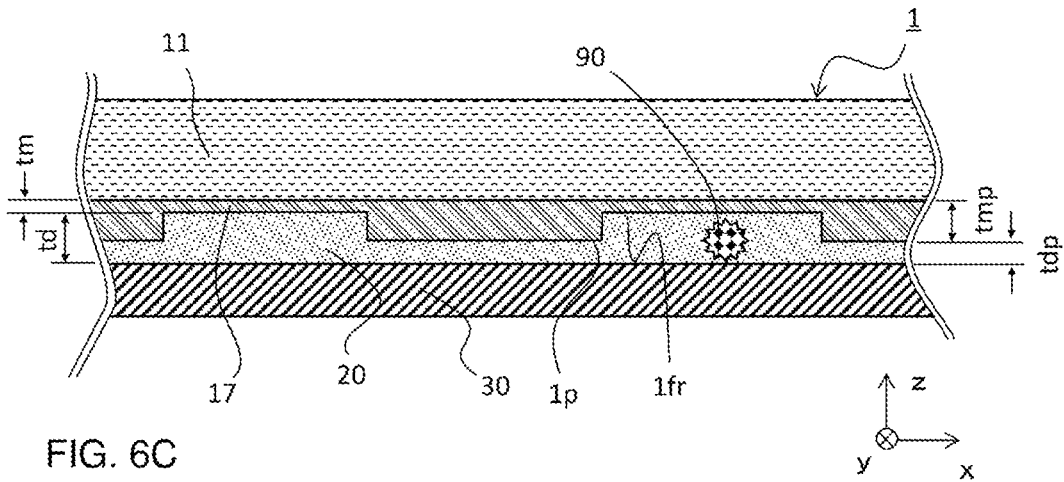

FIG. 5 and FIG. 6A to FIG. 6C serve for explaining a configuration of a semiconductor device according to Embodiment 3, in which FIG. 5 is a plan view of the semiconductor device as viewed from the side of its rear surface serving as a surface to be bonded to an assembly board, and FIG. 6A to FIG. 6C are a set of respective sectional end views in different cutting planes, of the semiconductor device in a state bonded to the assembly board, and shows a sectional end view (FIG. 6A) taken along a C-C line in FIG. 5; a sectional end view (FIG. 6B) taken along a D-D line in FIG. 5; and a sectional end view (FIG. 6C) taken along an E-E line in FIG. 5. Except for how the protrusion portion is located, Embodiment 3 is the same as Embodiment 1, so that, for the same components, the same reference numerals will be given. Further, FIG. 2 will be also employed without change.

In the semiconductor device 1 according to Embodiment 3, as shown in FIG. 5, at the circumferential edge portion on the rear surface 1fr-side, a protrusion portion 1p which protrudes in the thickness direction is formed intermittently along the circumferential direction. Other than that, as has been described in Embodiment 1 using FIG. 2, there are formed the wiring pattern 12 for making electrical connections for the respective electronic components; the front face electrode 13; and the via holes 1h that are each open onto the rear surface 11fr of the base member 11 and whose inner walls are each covered with a conductor for making an electrical connection with the front face electrode 13.

The protrusion portion 1p intermittently disposed in Embodiment 3 results from the circumferential edge portion of the rear face electrode 17 by increasing its thickness tm like in Embodiment 1 (up to the thickness tmp) but only at its necessary parts, as shown in FIG. 6A. Accordingly, as shown in FIG. 6A to FIG. 6C, at the circumferential edge portion, a protrusion part 1p with a protrusion height Δt is formed intermittently along the circumferential direction.

This configuration can be achieved such that, at the time of formation of the rear face electrode 17, after forming it on the entire area with the usual thickness tm, a pattern is formed thereon using, for example, a resist, whereby only necessary parts in the circumferential chip-edge portion of that electrode are selectively thickened up to the thickness tmp.

The semiconductor device 1 according to Embodiment 3 differs from those of Embodiments 1 and 2 in that the protrusion portion 1p is disposed intermittently along the circumferential edge portion. However, the protrusion portion 1p disposed intermittently is arranged so as to surround the major area, so that the semiconductor device 1 is never inclined with respect to the assembly board 30. Thus, like in the case where the protrusion portion 1p is formed so as to continue entirely circumferentially, it is possible to control the thickness td of the die bonding member 20 on the major area. Namely, the effect of increasing the thickness td to the extent that the influence of the foreign substance 90 is prevented, could be considered to be the same in both cases, and thus operations and effects similar to the foregoing can be achieved.

Furthermore, since the protrusion portion 1p is disposed intermittently along the circumferential direction, when the foreign substance 90 is adhered, even though rarely, to the circumferential edge portion as shown in FIG. 6C, if it is adhered thereto in the intermittent region, the influence of the foreign substance 90 can also be eliminated. The locations that surround the major area are not limited to those in the example shown in FIG. 5, and may be set dispersedly, for example, at four corners or four sides.

Embodiment 4

In the above Embodiment 3, a case has been described where the protrusion portion to be disposed intermittently along the circumferential direction is formed by varying the thickness of the rear face electrode. In Embodiment 4, a case will be described where an intermittent protrusion portion is formed by varying the thickness of the base member itself in a manner similar to the manner in Embodiment 2 that is different to that in Embodiment 1.

Figure 7:
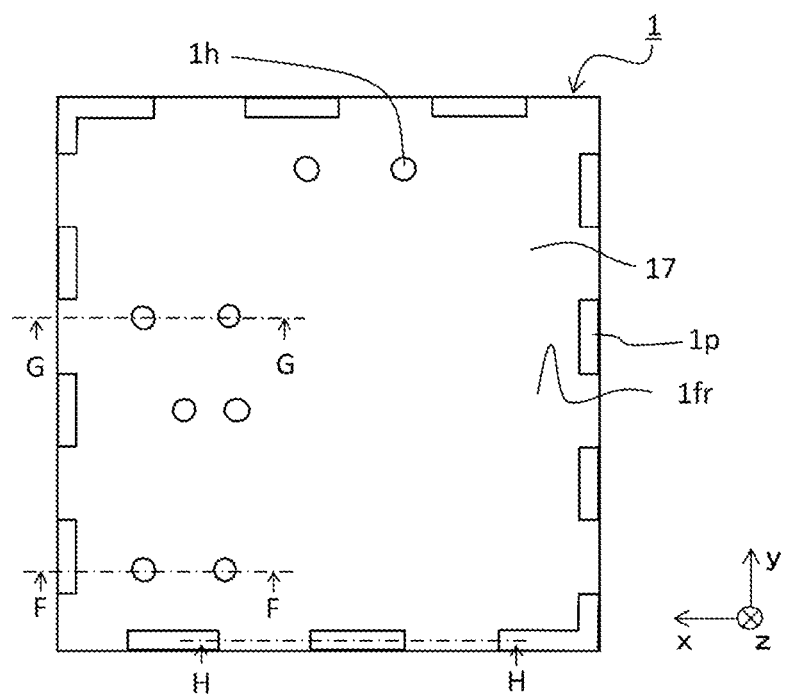
FIG. 7 is a plan view of a semiconductor device according to Embodiment 4 viewed from its rear face side.
Figure 8A:
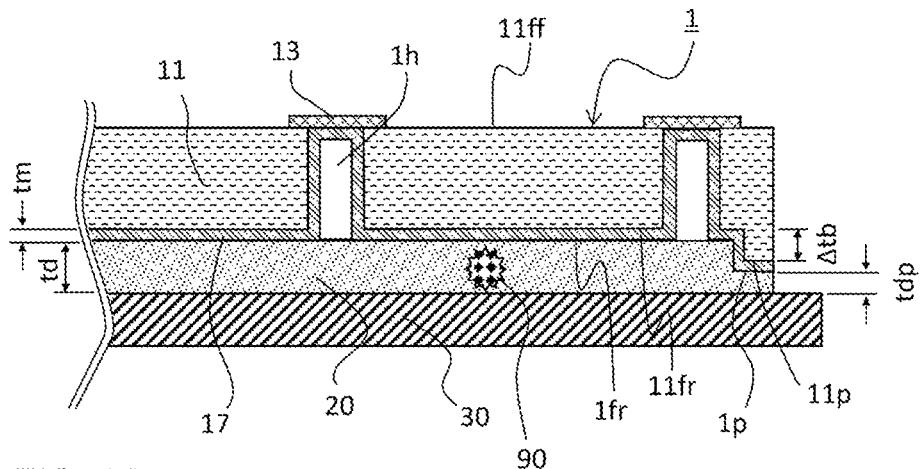
FIG. 8A to FIG. 8C are, respectively, sectional end views at different cutting positions, of the semiconductor device according to Embodiment 4 in a state bonded to an assembly board.
Figure 8B:
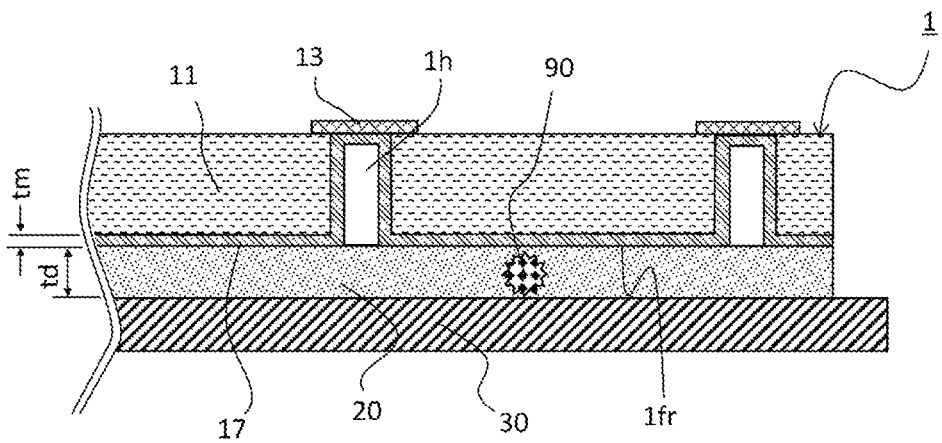
Figure 8C:
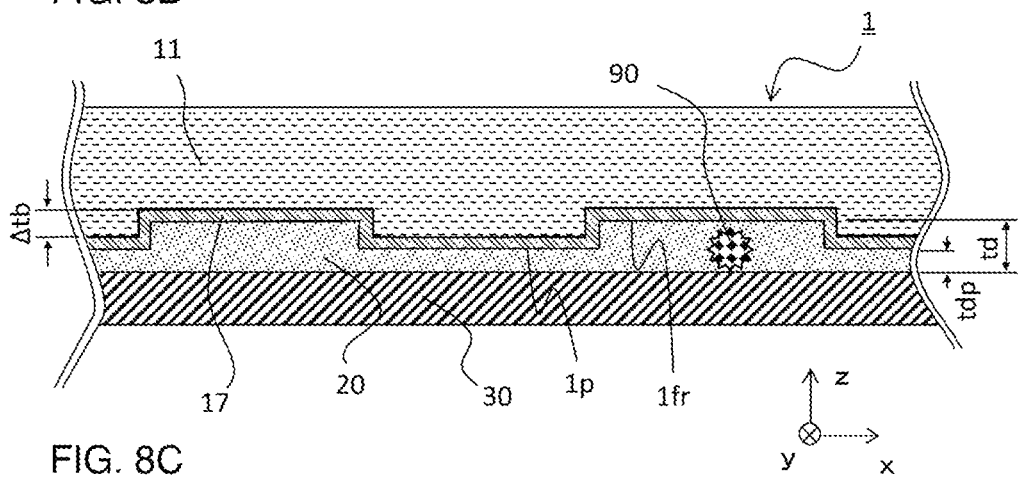

FIG. 7 and FIG. 8A to FIG. 8C serve for explaining a configuration of a semiconductor device according to Embodiment 4, in which FIG. 7 is a plan view of the semiconductor device as viewed from the side of its rear surface serving as a surface to be bonded to an assembly board, and FIG. 8A to FIG. 8C are a set of respective sectional end views in different cutting planes, of the semiconductor device in a state bonded to the assembly board, and shows a sectional end view (FIG. 8A) taken along an F-F line in FIG. 7; a sectional end view (FIG. 8B) taken along a G-G line in FIG. 7; and a sectional end view (FIG. 8C) taken along an H-H line in FIG. 7. In Embodiment 4, the structure of the protrusion portion is similar to that in Embodiment 2 and how the protrusion portion is located is similar to that in Embodiment 3. In addition, for the same components, the same reference numerals will be given. Further, FIG. 2 will be also employed without change.

Also in the semiconductor device 1 according to Embodiment 4, like in Embodiment 3 and as shown in FIG. 7, at the circumferential edge portion on the rear surface 1fr-side, a plurality of protrusion portions is formed intermittently along that circumferential edge portion. Further, like in Embodiment 2 and as shown in FIG. 8A to FIG. 8C, an intermittent base-member protrusion part 11p is formed along the circumferential edge portion of the base member 11 on its side where the rear face electrode 17 is to be formed, so that the plurality of protrusion portions 1p is formed in which the base-member protrusion part is covered with a part of the rear face electrode 17 with a thickness tm that is the same as its thickness in the major area.

Further, as has been described in Embodiment 1 using FIG. 2, there are formed the wiring pattern 12 for making electrical connections for the respective electronic components; the front face electrode 13; and the via holes 1h that are each open onto the rear surface 11fr of the base member 11 and whose inner walls are each covered with a conductor for making an electrical connection with the front face electrode 13.

For this configuration, the base member 11 is formed into a thin plate shape like in Embodiment 2 and then, epi layers are further formed on intermittently selected parts in the circumferential edge portion on the side where the rear face electrode 17 is to be formed, to thereby form the base-member protrusion part 11p with the protrusion height Δtb. Then, after the formation of the front face electrode 13 and boring of the via holes 1h, the rear face electrode 17 with a uniform thickness tm (1 to 5 μm) is formed entirely on the rear surface, so that the intermittent protrusion portion 1p with the protrusion height Δt (≈Δtb) can be achieved.

Although the protrusion portion 1p differs from that of Embodiment 3 in terms of internal structure, they could be considered to be the same in terms of contour, so that the device is used in a state joined using the die bonding member 20 to the assembly board 30. At that time, when the protrusion height is set similar to the protrusion height Δt (the protrusion height Δtb, in manufacturing setting) described in Embodiment 1, a function that is similar to that in Embodiment 1 is obtained against the foreign substance 90 and thus, operations and effects similar to the foregoing will be achieved. Furthermore, an effect due to intermittent arrangement described in Embodiment 3 will also be achieved.

It should be further noted that, in this application, a variety of exemplary embodiments and examples have been described; however, every characteristic, configuration or function that has been described in one or more embodiments, is not limited to being applied to a specific embodiment, and may be applied singularly or in any of various combinations thereof to another embodiment. Accordingly, an infinite number of modified examples that have been not exemplified here are supposed within the technical scope disclosed in the present description. For example, such cases shall be included where at least one configuration element is modified; where at least one configuration element is added or omitted; and furthermore, where at least one configuration element is extracted and combined with a configuration element of another embodiment.

For example, the protrusion portion 1p may be a combination of a base-member protrusion part 11p and a thick film part 17p, and may be made up of another material regardless of its electrical conductivity. Further, in the respective foregoing Embodiments, such cases have been described where, as a preferred material of the base member 11, GaAs, GaN or SiC which is a wide bandgap semiconductor material is used; however, this is not limitative, and the material may be another semiconductor material. Further, such cases have been described where the MMIC is constituted; however, this is not limitative, and the semiconductor device may be of a single transistor so far as it has a thin plate shape and provided with the via hole 1h.

Furthermore, such cases have been described where the conductor that covers the inner wall of the via hole 1h is formed integrally with the rear face electrode 17; however, this is not limitative, and it may be formed separately using the same material or a different material. Also, the inner wall is not required to be entirely covered with that conductor, so far as the front face electrode 13 and the rear face electrode 17 are electrically continuous with each other. Further, the material of the front face electrode 13 and the rear face electrode 17 is not limited to gold and thus may be another material. Furthermore, for the die bonding member 20, so far as its thickness range is controllable, any material can be adapted provided that the protrusion height Δt is adjusted according to the property thereof.

As described above, the semiconductor device 1 according to each of Embodiments is configured to comprise: the base member 11 of a semiconductor material 13 which forms a thin plate shape; the front face electrode which is placed on one of surfaces (front surface 11ff) of the base member 11; the rear face electrode 17 which covers another one of the surfaces (rear surface 11fr) of the base member 11; and the via hole 1h which forms a hole shape provided with the front face electrode 13 as a bottom and being open onto said another surface (11fr), and through which the front face electrode 13 and the rear face electrode 17 are electrically connected to each other by means of a conductor extending on the inner wall in the thickness direction; wherein, at the circumferential edge portion of the base member on its side where said another surface (rear surface 11fr) is located, the protrusion portion 1p which protrudes in the thickness direction (z-direction) is disposed. Thus, it is possible to suppress the occurrence of a crack at a portion around the via hole 1h by an impact at the time the adhered foreign substance 90 is subjected to a load. Namely, it is possible to establish both reduction of the parasitic inductance and prevention of the occurrence of a crack at the time of manufacturing, to thereby provide a semiconductor device with a high productivity.

In that case, when the protrusion portion 1p is configured to continue entirely circumferentially, it is possible to ensure parallelism between the rear surface 1fr of the semiconductor device 1 and the assembly board 30 and to maintain the gap (thickness td) required for preventing the influence of the foreign substance 90, entirely over the major area.

Instead, when the protrusion portion 1p is configured to be disposed intermittently along the circumferential direction, it is also possible to reduce the influence of the foreign substance 90 at the time it is adhered to the circumferential end portion.

If the protrusion portion 1p is configured to be formed using the thick film part 17p provided in the rear face electrode 17, it is possible to easily control the protrusion height Δt by a simple combination of masking and plating steps.

When the protrusion portion 1p is configured to be formed using the base-member protrusion part 11p provided in the base member 11, the protrusion portion 1p can be formed without increasing the usage of a noble metal such as gold to be used for the electrode.

When the protrusion height Δt of the protrusion portion 1p is not less than 10 μm and not more than 40 μm, even when the manufacturing is performed under any processing conditions, it is practically possible to suppress the influence with respect to the foreign substance 90.

Furthermore, when the protrusion height Δt is set to be not less than 13 μm and not more than 23 μm, such a semiconductor device is achieved that is highly productive, taking into account both the time and effort for forming the protrusion portion 1p and handling the material, etc. and the reduction in yield due to a crack.

When the application target is a semiconductor device 1 in which a monolithic microwave integrated circuit is formed, the influence of the parasitic inductance is especially large, so that the number of the via holes 1h as countermeasures increases, resulting in an increased need for preventing a crack.

Further, when one of GaAs, GaN and SiC is used as the semiconductor material, since its hardness is higher and its heat resisting temperature is also higher as compared with usual silicon, the temperature at the time of die bonding tends to become higher correspondingly. Thus, at the time the foreign substance 90 is adhered, the stress is more likely to be concentrated on the via hole 1$h$, so that the value of an effect of preventing a crack becomes higher.

DESCRIPTION OF REFERENCE NUMERALS AND SIGNS

1: semiconductor device, 1$fr$: rear surface, 1$h$: via hole, 1$p$: protrusion portion, 11: base member, 11$ff$: front surface (one surface), 11$fr$: rear surface (another surface), 11$p$: base-member protrusion part, 13: front face electrode, 17: rear face electrode, 17$p$: thick film part, 20: die bonding member, 30: assembly board, 90: foreign substance, Δ$t$: protrusion height.

The invention claimed is:

1. A semiconductor device, comprising:
a base member of a semiconductor material which forms a thin plate shape;
a front face electrode which is placed on one of surfaces of the base member;
a rear face electrode which covers another one of the surfaces of the base member; and
plural via holes, each of which forms a hole shape provided with the front face electrode as a bottom and being open onto said another surface, and through which the front face electrode and the rear face electrode are electrically connected to each other;
wherein, at a circumferential edge portion of the base member on its side where said another surface is located, a protrusion portion which protrudes in a thickness direction is disposed intermittently along a circumferential direction, and an entire portion of the another surface between the plural via holes is recessed relative to the protrusion in the thickness direction.

2. The semiconductor device of claim 1, wherein the protrusion portion is formed using a base-member protrusion part provided in the base member.

3. The semiconductor device of claim 1, wherein a monolithic microwave integrated circuit is formed.

4. The semiconductor device of claim 1, wherein, as the semiconductor material, one of GaAs, GaN and SiC is used.

5. A semiconductor device, comprising:
a base member of a semiconductor material which forms a thin plate shape;
a front face electrode which is placed on one of surfaces of the base member;
a rear face electrode which covers another one of the surfaces of the base member; and
plural via holes, each of which forms a hole shape provided with the front face electrode as a bottom and being open onto said another surface, and through which the front face electrode and the rear face electrode are electrically connected to each other;
wherein, at a circumferential edge portion of the base member on its side where said another surface is located, a protrusion portion is disposed which is formed using a thick film part provided in the rear face electrode and which protrudes in a thickness direction and an entire portion of the another surface between the plural via holes is recessed relative to the protrusion in the thickness direction.

6. The semiconductor device of claim 5, wherein the protrusion portion continues entirely circumferentially.

7. The semiconductor device of claim 5, wherein a monolithic microwave integrated circuit is formed.

8. The semiconductor device of claim 5, wherein, as the semiconductor material, one of GaAs, GaN and SiC is used.

9. A semiconductor device, comprising:
a base member of a semiconductor material which forms a thin plate shape;
a front face electrode which is placed on one of surfaces of the base member;
a rear face electrode which covers another one of the surfaces of the base member; and
a via hole which forms a hole shape provided with the front face electrode as a bottom and being open onto said another surface, and through which the front face electrode and the rear face electrode are electrically connected to each other;
wherein, at a circumferential edge portion of the base member on its side where said another surface is located, a protrusion portion which protrudes in a thickness direction is disposed; and
wherein a protrusion height of the protrusion portion is not less than 10 µm and not more than 40 µm.

10. The semiconductor device of claim 9, wherein the protrusion height is not less than 13 µm and not more than 23 µm.

11. The semiconductor device of claim 10, wherein the protrusion portion continues entirely circumferentially.

12. The semiconductor device of claim 10, wherein the protrusion portion is formed using a base-member protrusion part provided in the base member.

13. The semiconductor device of claim 9, wherein the protrusion portion continues entirely circumferentially.

14. The semiconductor device of claim 9, wherein the protrusion portion is formed using a base-member protrusion part provided in the base member.

15. The semiconductor device of claim 9, wherein a monolithic microwave integrated circuit is formed.

16. The semiconductor device of claim 9, wherein, as the semiconductor material, one of GaAs, GaN and SiC is used.

* * * * *